United States Patent [19]

Sakamoto

[11] Patent Number: 4,777,461
[45] Date of Patent: Oct. 11, 1988

[54] LC COMPOSITE COMPONENT

[75] Inventor: Yukio Sakamoto, Nagaokakyo, Japan

[73] Assignee: Murata Manufacturing Co., Ltd., Nagaokakyo, Japan

[21] Appl. No.: 66,622

[22] Filed: Jun. 26, 1987

[30] Foreign Application Priority Data

Jul. 1, 1986 [JP] Japan .......................... 61-101855[U]

[51] Int. Cl.⁴ ...................... H03H 7/00; H01F 15/10
[52] U.S. Cl. ................................... 333/184; 336/192
[58] Field of Search .............. 333/181, 184, 185, 167; 361/405; 336/192, 198, 208

[56] References Cited

U.S. PATENT DOCUMENTS 3,295,056  12/1966  Matsushima et al ........... 333/185 X

*Primary Examiner*—Thomas J. Kozma
*Attorney, Agent, or Firm*—Wenderoth, Lind & Ponack

[57] ABSTRACT

An LC composite component of the combination of a coil inductor and a capacitor, in which a bobbin having first and second flanges formed at both ends of a coil winding portion is provided on at least one of the flanges with first and second lead-out electrodes, and both lead-out terminals of the coil wound around the coil winding portion being connected to the first and second lead-out electrodes. The flanges provided with the first and second lead-out electrodes is made from a dielectric material. A ground electrode is provided on the flange between both the electrodes, and capacitors are formed between the first lead-out electrode and the ground electrode and between the second electrode and the ground electrode. Thus, the combination of the capacitor and coil inductor is small and easy to produce.

4 Claims, 1 Drawing Sheet

LC COMPOSITE COMPONENT

FIELD OF THE INVENTION

The present invention relates to an LC composite component, and more particularly to an LC composite component of the combination of a coil inductor and a capacitor, and suitable for use as a low-pass filter.

BACKGROUND OF THE INVENTION

Conventionally, this kind of LC composite component, for example, as shown in FIG. 5, has a cylindrical capacitor 5 comprising electrodes 2 and 3 disconnected from each other and formed inside a cylindrical dielectric 1 (hereinafter referred to as the inside electrodes 2 and 3) and an electrode 4 (hereinafter referred to as the outside electrode 4) opposite in common to the inside electrodes 2 and 3 and provided outside the same, and a ferrite bead 7 through which a central conductor 6 is inserted, so that solder 8 filled at both openings of the cylindrical capacitor 5 connects the inside electrodes 2, 3 and central conductor 6 respectively. Reference numeral 9 designates an eyelet member which is, as needed, fitted onto the outside electrode 4 at the capacitor 5 and connected to the electrode 4 by solder 10.

Such a conventional LC composite component constructed as above-mentioned comprises the combination of the capacitor 5 and a ferrite bead 7 separate therefrom, and is thereby both large and complicated to manufacture.

OBJECT OF THE INVENTION

An object of the invention is to provide an LC composite component of an inductor and a capacitor integral with each other and being both small and easy to manufacture.

These above and other objects and features of the invention will appear more fully from the following description in accordance with the accompanying drawings.

DETAILED DESCRIPTION OF THE INVENTION

Figure 1:
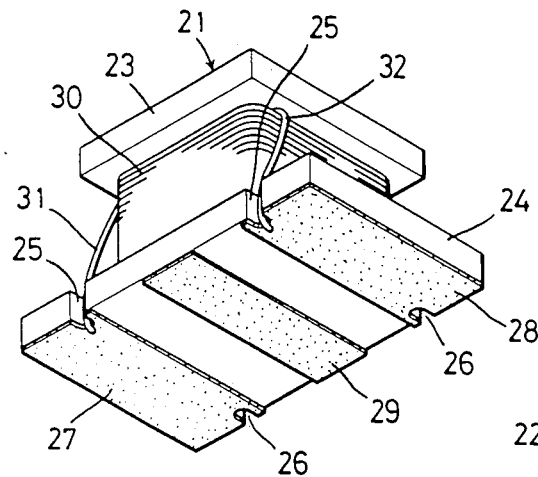
FIG. 1 is a perspective view of a first embodiment of an LC composite component of the invention, when viewed from the rear.
Figure 2:
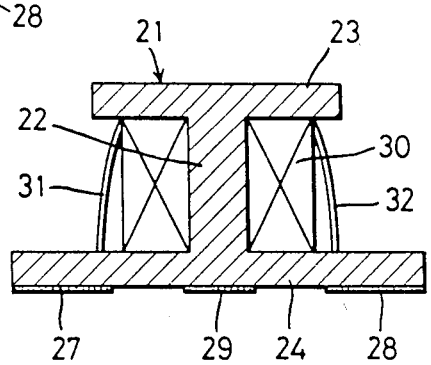
FIG. 2 is a longitudinal sectional view of the first embodiment of FIG. 1.

In the first embodiment of the invention shown in FIGS. 1 and 2, a bobbin 21 is made from a dielectric material and provided at both ends of a prismatic coil winding portion 22 with a first flange 23 and a second flange 24.

The second flange 24 is at the mounting side of a printed circuit board or the like, and is larger in width than the first flange 23. Pairs of recesses 25 and 26 are provided at a pair of lengthwise ends of the second flange 24. Reference numerals 27 and 28 designate first and second lead-out electrodes formed at both lengthwise end sides of the lower surface of the second flange 24 serving as the mounting surface therefor. 29 designates a ground electrode provided between the lead-out electrodes 27 and 28 on the lower surface of the second flange 24, and 30 designates a coil wound around the coil winding portion 22. A pair of lead-out terminals 31 and 32 of the coil 30 are connected by soldering or the like (not shown) with the first and second lead-out electrodes 27 and 28 through the recesses 25 and 26 respectively.

Figure 3:
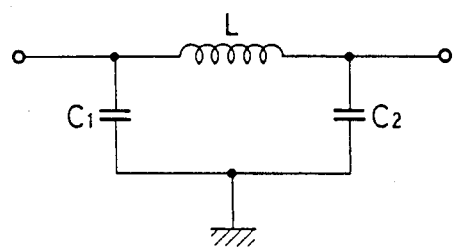
FIG. 3 is an equivalent circuit diagram of the LC composite component in FIG. 1.

The first embodiment of the LC composite component constructed as above-mentioned forms an equivalent circuit comprising an inductor L of the coil 30, a capacitor $C_1$ formed between the first lead-out electrode 27 and the earth electrode 29, and a capacitor $C_2$ formed between the second lead-out electrode 28 and the ground electrode 29 as shown FIG. 3.

The first embodiment of the LC composite component of the invention, which forms such equivalent circuit, connects by soldering or the like the first and second lead-out electrodes 27 and 28 and ground electrode 29 formed on the lower surface of the second flange 24 with a predetermined pattern formed on a mounting substrate such as a printed circuit board or the like, and is mounted thereon, thereby being used as a low-pass filter.

Figure 4:
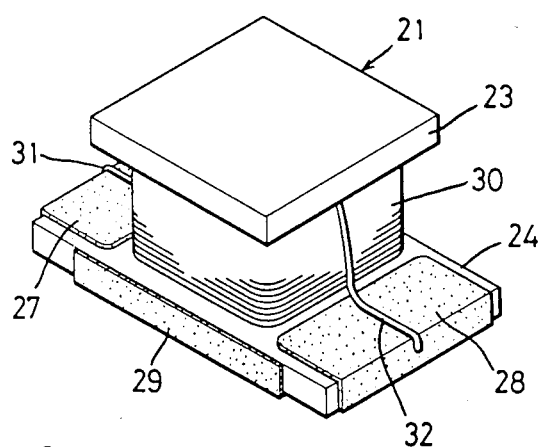
FIG. 4 is a perspective view of a second embodiment of the LC composite component of the invention.
Figure 5:
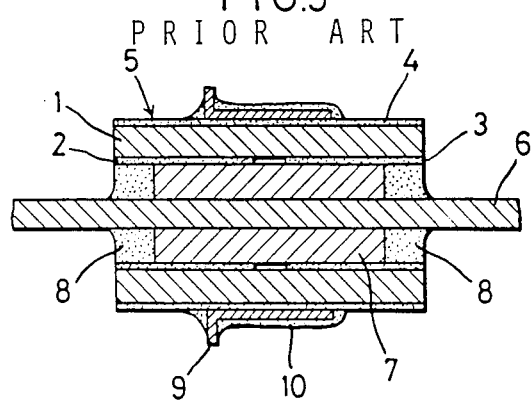
FIG. 5 is a longitudinal sectional view of the PRIOR ART LC composite component.

Referring to FIG. 4, a second embodiment of the LC composite component of the invention is shown.

The fundamental construction of the second embodiment is the same as that of the first embodiment shown in FIGS. 1 and 2, in which like components are designated by like reference numerals and omitted by way of explanation. Only the differences between the first embodiment and the second embodiment will be described.

In the second embodiment, first and second lead-out electrodes 27 and 28 are formed in a continuing manner at both lengthwise end sides of the upper surface of the second flange 24 and both lengthwise end faces. A ground electrode 29 is formed on the lower surface of the second flange 24 and between the first and second lead-out electrodes 27 and 28, and includes portions opposite to the first and second lead-out electrodes formed on the upper surface of the second flange 24, and bridges both lateral side surfaces in part of the flange 24. In a case where the second embodiment of the LC composite component in FIG. 4 is mounted on a printed circuit board, the first and second lead-out electrodes 27 and 28 formed at both the lengthwise end faces at the second flange 24, the ground electrode 29 formed at the lower surface serving as the mounting surface for the second flange 24 and at both the lateral side surfaces thereof, and the predetermined pattern on the printed circuit board, need only be connected by soldering or the like with each other. Hence, even when the portion of the ground electrode 29 formed on the lower surface of the second flange 24 is made larger, intervals between the ground electrode 29 and the first and second lead-out electrodes 27 and 28 formed at both the lengthwise end faces of the same can be made larger respectively, thereby facilitating mounting of the composite component and improving the reliability of the mounting.

The portions of the ground electrode 29 formed at both the lateral side surfaces of the second flange 24 are used for an improvement in the reliability of soldering the component to the printed circuit board or the like. Therefore, when reliability of mounting by soldering or the like is not especially required, the portion of ground electrode 29 at both the lateral surfaces of the flange 24 need not be formed. Also, both lead-out terminals 31 and 32 of a coil 30 are connected by soldering with the portions of first and second lead-out electrodes 27 and 28 formed on the upper surface of the flange 24. Accordingly, in the second embodiment, both the lead-out terminals 31 and 32 of the coil 30 need not extend toward the lower surface of the flange 24, thereby requiring no recesses 25 and 26 as in the flange 24 as in the first embodiment of FIG. 1.

In addition, the LC composite component of this invention is not defined solely by the aforesaid embodiments and may be changed without departing from the scope of the invention.

For example, the shapes and positions of the first and sescond lead-out electrodes are optional, and the ground electrode may properly be changed in the same manner.

The bobbin need not be made from a dielectric material in its entirety, but at least the flange on which the first and second lead-out electrodes and ground electrode are formed need be made from a dielectric material. Other portions of the flange may be made from other materials, such as magnetic substance.

Furthermore, the first and second lead-out electrodes and the earth electrode may be provided on both the first and second flanges.

Also, one of the first and second flanges need not be larger in width than the other, but they may be similar in size.

The LC composite component of the invention is not restricted to being low-pass filter.

As seen from the above, the LC composite component of the invention need not be formed in the combination of the capacitor and the inductor separate therefrom, and is both small and easy to manufacture.

Although several embodiments have been described, they are merely exemplary of the invention and not to be construed as limiting, the invention being defined solely by the appended claims.

I claim:

1. An LC composite component comprising a bobbin having first and second flanges formed at both ends of a coil winding portion of said bobbin, first and second lead-out electrodes formed on at least one of said first and second flanges, a coil wound around said coil winding portion and connected by a pair of lead-out terminals to said first and second electrodes respectively, at least said at least one flange on which said first and second lead-out electrodes are formed being made from a dielectric material, and a ground electrode formed on said at least one flange between said lead-out electrodes.

2. An LC composite component as set forth in claim 1, wherein said first and second lead-out electrodes and said ground electrode are juxtaposed on the lower surface of said at least one flange, and said at least one flange serves as a mounting surface therefor.

3. An LC component as set forth in claim 1, wherein said first and second lead-out electrodes are formed on said at least one flange in a continuing relationship from the upper surfaces at both end sides of said at least one flange to both end faces of said at least one flange respectively, and said ground electrode is formed on the lower surface of said at least one flange between said first and second lead-out electrodes and includes portions opposite to the portions of said first and second lead-out electrodes formed on the upper surfaces of said at least one flange.

4. An LC composite component as set forth in claim 1, wherein said lead-out terminals of said coil are led through recesses provided in at least said at least one flange and connect with said first and second electrodes respectively.

* * * * *